United States Patent
Song et al.

(10) Patent No.: US 10,897,129 B2
(45) Date of Patent: Jan. 19, 2021

(54) QUENCH PROTECTION DEVICE OF SUPERCONDUCTING MAGNET SYSTEM AND WORKING METHOD THEREOF

(71) Applicant: HEFEI CAS ION MEDICAL AND TECHNICAL DEVICES CO., LTD, Anhui (CN)

(72) Inventors: Yuntao Song, Anhui (CN); Chunlong Zou, Anhui (CN); Kaizhong Ding, Anhui (CN); Yanfang Bi, Anhui (CN); Xufeng Liu, Anhui (CN); Rui Hu, Anhui (CN); Zhengwen Xu, Anhui (CN); Hansheng Feng, Anhui (CN); Yonghua Chen, Anhui (CN); Gen Chen, Anhui (CN); Qingxi Yang, Anhui (CN); Junjun Li, Anhui (CN)

(73) Assignee: HEFEI CAS ION MEDICAL AND TECHNICAL DEVICES CO., LTD, Hefei (CN)

( * ) Notice: Subject to any disclaimer, the term of this patent is extended or adjusted under 35 U.S.C. 154(b) by 0 days.

(21) Appl. No.: 16/824,340

(22) Filed: Mar. 19, 2020

(65) Prior Publication Data
US 2020/0220345 A1    Jul. 9, 2020

Related U.S. Application Data

(63) Continuation of application No. PCT/CN2018/109797, filed on Oct. 11, 2018.

(51) Int. Cl.
*H01F 6/06*     (2006.01)
*H02H 7/00*     (2006.01)
(Continued)

(52) U.S. Cl.
CPC ....... *H02H 7/001* (2013.01); *G01R 19/16528* (2013.01); *H01F 6/02* (2013.01);
(Continued)

(58) Field of Classification Search
USPC .......................................... 361/19
See application file for complete search history.

(56) References Cited

U.S. PATENT DOCUMENTS

| 7,116,535 B2 * | 10/2006 | Huang .............. G01R 33/288 361/19 |
| 9,240,681 B2 | 1/2016 | Rajput-Ghoshal et al. |

(Continued)

FOREIGN PATENT DOCUMENTS

| CN | 104065037 A | 9/2014 |
| CN | 106356813 A | 1/2017 |
| CN | 107994544 A | 5/2018 |

*Primary Examiner* — Danny Nguyen
(74) *Attorney, Agent, or Firm* — Wayne & Ken, LLC; Tony Hom

(57) ABSTRACT

Disclosed a quench protection device of a superconducting magnet system, including a superconducting coil set; the superconducting coil set comprises two superconducting coils (5) which are symmetrical arranged, and each of the two superconducting coils (5) is connected in parallel with a protection diode (4); the superconducting coils and the protection diode are connected with the power supply via a conductive wire; the superconducting coils set are connected in parallel with a quench protection unit (6), a change-over switch (3) is arranged on a circuit of the two superconducting coils, the protection diode, and the power supply, and the change-over switch (3) is connected with an external resistor via a conductive wire (2). The change-over switch of the quench protection device connects the superconducting coil and an external resistance, which realizes the quench protection of the superconducting coil.

1 Claim, 1 Drawing Sheet

(51) Int. Cl.
 _G01R 19/165_ (2006.01)
 _H01F 6/02_ (2006.01)
 _G01R 33/035_ (2006.01)
 _H02H 9/02_ (2006.01)
 _G01F 23/24_ (2006.01)

(52) U.S. Cl.
 CPC .............. _H01F 6/06_ (2013.01); _G01F 23/24_ (2013.01); _G01R 19/165_ (2013.01); _G01R 33/035_ (2013.01); _H02H 9/02_ (2013.01)

(56) References Cited

U.S. PATENT DOCUMENTS

| | | | | |
|---|---|---|---|---|
| 2007/0024404 | A1* | 2/2007 | Westphal | H01F 6/00 335/216 |
| 2009/0002902 | A1* | 1/2009 | Bittner | H02H 7/001 361/19 |
| 2009/0190274 | A1* | 7/2009 | Ko | H02H 9/023 361/19 |
| 2010/0056378 | A1* | 3/2010 | Timinger | G01R 33/3815 505/162 |
| 2010/0253373 | A1* | 10/2010 | Kawashima | G01R 31/50 324/706 |

* cited by examiner

QUENCH PROTECTION DEVICE OF SUPERCONDUCTING MAGNET SYSTEM AND WORKING METHOD THEREOF

CROSS-REFERENCE TO RELATED APPLICATIONS

This application is a continuation of International Application No. PCT/CN2018/109797 with a filing date of Oct. 11, 2018, designating the United states, now pending, and further claims to the benefit of priority from Chinese Patent Application No. 201711310320.7, filed on Dec. 11, 2017. The content of the aforementioned application, including any intervening amendments thereto, is incorporated herein by reference in its entirety.

TECHNICAL FIELD

The present application relates to accelerators, particularly to a protection device of a superconducting proton accelerator, and more particularly to a quench protection device of a superconducting magnet system and a working method thereof.

BACKGROUND

Zero resistance is one of the basic properties of superconductors in a superconducting state, and a superconducting magnet operates in an ultra-low temperature. When a local superconductor of superconducting coils carrying a current changes to a normal state, a resistance is generated in the local superconductor, and the generated resistance may bring an additional thermal load to the entire system of the superconducting magnet, which is called as superconducting magnet quench.

If not being detected and stopped in time, the local quench may easily lead to a rapid expansion, thus bringing a severe thermal load or even a damage to an entire low-temperature system, or even causing the superconducting magnet to burn out.

Therefore, for the safe operation of the superconducting coil, a corresponding quench protection device needs to be designed. After the local superconducting magnet has a quench state, response measures are initiated in time to protect the superconducting coil and the low-temperature system. Therefore, the design of the quench solution of the superconducting magnet and the R&D of the quench device are an essential step in the design of the superconducting magnet.

SUMMARY

In order to overcome the above technical problems, the invention aims to provide a quench protection device of a superconducting magnet system and a working method thereof. By mounting a protection diode and a quench protection unit at a superconducting coil set, the invention effectively solves the problem of the damage of a superconducting excitation coil in a superconducting cyclotron when being quenched.

The object of the invention can be realized by the following technical solutions.

Provided is a quench protection device of a superconducting magnet system, comprising a superconducting coil set; the superconducting coil set comprises two superconducting coils which are symmetrically arranged, and each of the two superconducting coils is connected in parallel with a protection diode; the superconducting coils and the protection diode are respectively connected with a power supply via a conductive wire; the superconducting coil set is connected in parallel with a quench protection unit; a change-over switch is arranged on a circuit of the two superconducting coils, the protection diode, and the power supply, and the change-over switch is connected with an external resistor via a conductive wire;

the quench protection unit comprises a preset module, a detection module, a determination module, and a control module of a quench signal which are sequentially connected via an induction line;

the preset module is configured to preset a voltage at two ends of the superconducting coil set;

the detection module is configured to detect a voltage at two ends of each of the two superconducting coils;

the determination module is configured to compare the voltage detected at the two ends of each of the superconducting coils with the preset voltage, and determine whether the two superconducting coil are in a quench state, so that a determination result is obtained; and the control module is configured to control the change-over switch to perform switching according to the determination result of the determination module.

In some embodiments, the conductive wire is a superconducting wire.

In some embodiments, the protection diode is a low temperature diode, and is arranged inside a low temperature container, and the protection diode is close to the two superconducting coils.

A working method of the quench protection device of a superconducting magnet system, comprising the following steps:

1) presetting a voltage at two ends of a superconducting coil set by the preset module;

2) detecting, by a detection module, a voltage at two ends of two superconducting coils, comparing and determining, by a determination module, based on the detected voltage and the preset voltage, and determining whether the two superconducting coils are in a quench state;

3) when the two superconducting coils are in an excitation state at which two ends of the protection diode have a low voltage, and a current is not allowed to be conducted in the protection diode; conducting the current via the superconducting coil set, and controlling a change-over switch to be connected with a power supply by a control module to form an excitation circuit;

4) when the two superconducting coils are in a quench state, since the voltage at two ends the protection diode is increased, conducting the current by the protection diode to shunt the current in the superconducting coil set; and controlling the change-over switch to be switched to connect with the external resistor by the control module to form a demagnetization circuit, so that the superconducting magnet system is protected.

In some embodiments, in step 2, when a ratio of the voltage at the two ends of the two superconducting coils to the preset voltage is in a range of 0.48-0.52:1, the two superconducting coils are determined to be in an excitation state; when the ratio of the voltage at the two ends of the two superconducting coils to the preset voltage is not in the range of 0.48-0.52:1, the superconducting coil are to determined to be in a quench state.

The invention has the following beneficial effects: the invention is simple and reasonable. By designing a quench protection unit and controlling a change-over switch, the superconducting coil is connected with an external resistor when the superconducting coil is in a quench state, which effectively and quickly realizes the quench protection of the superconducting coil. At the same time, the superconducting coil and the protection diode are connected in parallel, which solves the problem that the superconducting coil is damaged when a response of the quench protection unit is delayed. The effective combination of the two protection modes greatly reduces the probability of the damage of the superconducting excitation coil in the superconducting cyclotron, so the quench protection device of the superconducting magnet system of the present invention has good use and promotion values.

BRIEF DESCRIPTION OF THE DRAWINGS

The invention is further described below with reference to the drawings.

DETAILED DESCRIPTION OF EMBODIMENTS

In the following, the technical scheme in the embodiment of the invention is described clearly and completely in combination with embodiments of the invention. Obviously, the described embodiments are only a part of the embodiments of the invention. Based on the embodiments in the invention, all other embodiments obtained by those skilled in the art without any creative effort shall fall within the scope of the invention.

Figure 1:
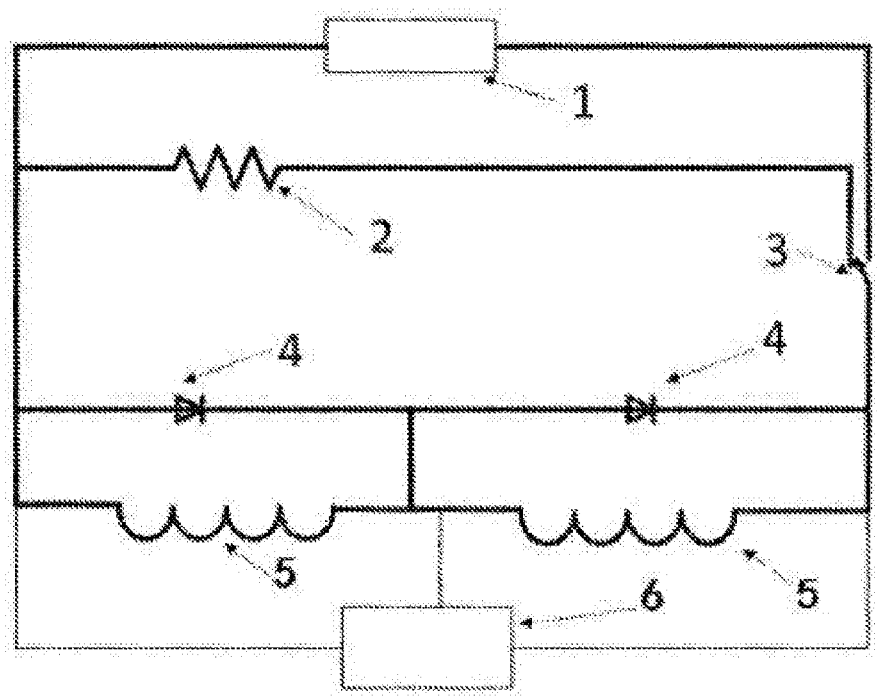
FIG. 1 is a schematic diagram of a circuit using a quench protection device of a superconducting magnet system according to the present invention.

As shown in FIG. 1, illustrated is a quench protection device of a superconducting magnet system, comprising a superconducting coil set; the superconducting coil set comprises two superconducting coils 5 which are symmetrically arranged, and each of the two superconducting coils 5 is connected in parallel with a protection diode 4; the superconducting coils 5 and the protection diodes 4 are respectively connected with a power supply 1 via a conductive wire; the superconducting coil set is connected in parallel with a quench protection unit 6, and the superconducting coil 5; a change-over switch 3 is arranged on a circuit of the two superconducting coils 5, the protection diode 4, and the power supply 1, and the change-over switch 3 is connected with an external resistor 2 via a conductive wire.

The conductive wire is a superconducting wire to minimize the influence of the resistance of the conductive wire on the entire circuit of the quench protection device.

The protection diode 4 is a low temperature diode which is arranged inside a low temperature container, such as a cryogenic container filled with liquid helium, and the protection diode 4 is close to the superconducting coil 5. When the superconducting coil 5 is in an excitation state, the two ends the protection diode 4 has a low voltage, so that a current is not allowed to be conducted in the protection diode 4.

When the two superconducting coils 5 are in a quench state, since the voltage at the two ends the protection diode 4 is increased, the protection diode 4 conducts the current to shunt the current in the superconducting coil set, to prevent the superconducting coil 5 from conducting a larger current, thereby protecting the superconducting coil 5 before the quench protection unit 6 controls the change-over switch 3, so that the problem of the response delay of the quench protection unit 6 can be solved.

Figure 2:
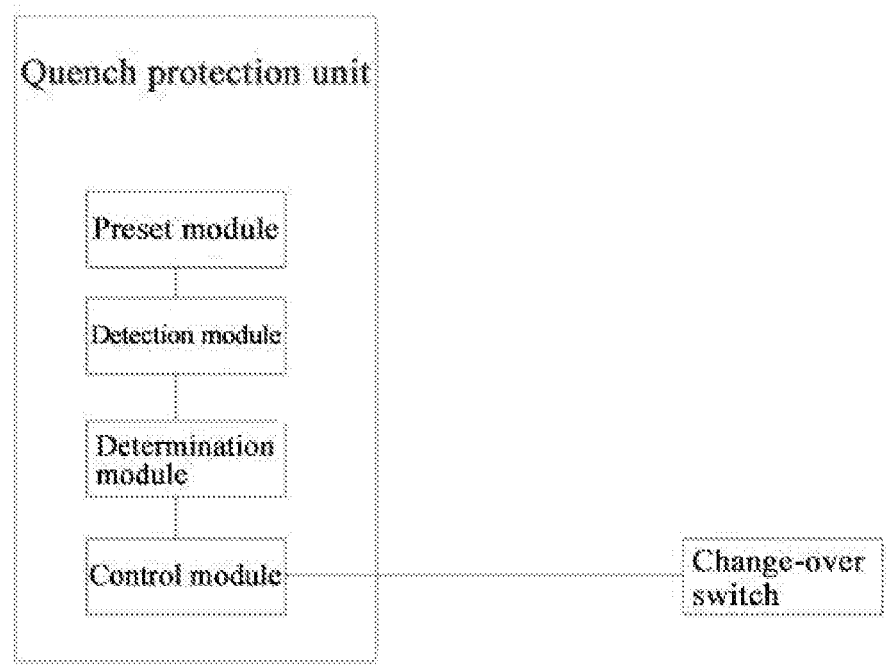
FIG. 2 is a block diagram of a quench protection unit according to the present invention.

As shown in FIG. 2, the quench protection unit 6 comprises a preset module, a detection module, a determination module, and a control module of a quench signal which are sequentially connected via an induction line.

The preset module is configured to preset a voltage at two ends of the superconducting coil set.

The detection module is configured to detect a voltage at two ends of each of the two superconducting coils 5.

The determination module is configured to compare the voltage detected at the two ends of each of the two superconducting coils 5 with the preset voltage, and determine whether the two superconducting coils 5 are in a quench state, so that a determination result is obtained.

The control module is configured to control the change-over switch 3 to perform switching according to the determination result of the determination module.

A working method of the quench protection device of a superconducting magnet system comprises the following steps:

1) A voltage at two ends of the superconducting coil set is preset by the preset module.

2) A voltage at two ends of two superconducting coils 5 is detected by a detection module, a comparison determination is performed based on the detected voltage and the preset voltage by the determination module to determine whether the two superconducting coils 5 are in a quench state;

when a ratio of the voltage at the two ends of the superconducting coils 5 and the preset voltage is in a range of 0.48-0.52:1, the two superconducting coils 5 are determined to be in an excitation state; when the ratio of the voltage at two ends of the two superconducting coils 5 to the preset voltage is not in the range of 0.48-0.52:1, the two superconducting coils 5 are determined to be in a quench state.

3) When the two superconducting coils 5 are in the excitation state at which the voltage at the two ends the protection diode 4 is low, the current is not allowed to conduct in the protection diode 4, the current is conducted by the superconducting coil set, and the change-over switch 3 is controlled to be connected with a power supply 1 by the control module to form an excitation circuit.

4) When the superconducting coils 5 are in a quench state, since the voltage at the two ends the protection diode 4 is increased, the protection diode 4 conducts the current which is shunted in the superconducting coil set; and the change-over switch 3 is controlled to be switched to connect with an external resistor 2 by the control module to form a demagnetization circuit, so that the superconducting magnet system is protected.

The above embodiments are only intended to illustrate the present invention. All details of the present invention are not described herein, so the above embodiments are not intended to limit the scope of the present invention. Obviously, various modifications and changes can be made according to the specification of the present invention. These embodiments described herein are intended to better explain the principle and practical applications of the invention, from which those skilled in the art can better understand and utilize the invention. The scope of the present invention is defined solely by the appended claims or equivalents thereof.

INDUSTRIAL PRACTICALITY

The present invention is simple and reasonable. By designing a quench protection unit 6 and controlling a change-over switch 3, the superconducting coil 5 is connected with an external resistor 2 when the superconducting coil 5 is in a quench state, which effectively and quickly realizes the quench protection of the superconducting coil. At the same time, the superconducting coil 5 and the protection diode 4 are connected in parallel, which solves the problem that the superconducting coil 5 is damaged when a response of the quench protection unit 6 is delayed. The effective combination of the two protection modes greatly reduces the probability of the damage of the superconducting excitation coil in the superconducting cyclotron, so the quench protection device of the superconducting magnet system of the present invention has good use and promotion values.

What is claimed is:

1. A working method of a quench protection device of a superconducting magnet system, comprising:
   1) presetting a voltage at two ends of a superconducting coil set via a preset module;
   2) detecting, by a detection module, a voltage at two ends of two superconducting coils, comparing and determining, by a determination module, based on the detected voltage and the preset voltage, and determining whether the two superconducting coils are in a quench state;
   3) when the two superconducting coils are in an excitation state at which two ends of the protection diode have a low voltage, and a current is not allowed to be conducted in the protection diode, conducting the current via the superconducting coil set, and controlling a change-over switch to be connected with a power supply by a control module to form an excitation circuit; and
   4) when the two superconducting coils are in a quench state, since the voltage at two ends of the protection diode is increased, conducting the current by the protection diode to shunt the current in the superconducting coil set; controlling the change-over switch to be switched to connect with an external resistor by the control module to form a demagnetization circuit, so that the superconducting magnet system is protected;
   wherein when a ratio of the voltage at the two ends of the two superconducting coils to the preset voltage is in a range of 0.48-0.52:1, the two superconducting coils are determined to be in an excitation state; when the ratio of the voltage at the two ends of the two superconducting coils to the preset voltage is not in the range of 0.48-0.52:1, the two superconducting coils are in a quench state.

* * * * *